United States Patent
Sarver et al.

(10) Patent No.: US 9,321,130 B2
(45) Date of Patent: Apr. 26, 2016

(54) LASER ABSORBING COMPOUNDS

(71) Applicant: Ferro Corporation, Mayfield Heights, OH (US)

(72) Inventors: Joseph E. Sarver, Washington, PA (US); Stephen Rozwood, Castle Shannon, PA (US); George E. Sakoske, Independence, OH (US); Terry J. Detrie, Washington, PA (US)

(73) Assignee: Ferro Corporation, Mayfield Heights, OH (US)

( * ) Notice: Subject to any disclaimer, the term of this patent is extended or adjusted under 35 U.S.C. 154(b) by 0 days.

(21) Appl. No.: 14/363,885

(22) PCT Filed: Mar. 1, 2013

(86) PCT No.: PCT/US2013/028760
§ 371 (c)(1),
(2) Date: Jun. 9, 2014

(87) PCT Pub. No.: WO2013/131064
PCT Pub. Date: Sep. 6, 2013

(65) Prior Publication Data
US 2014/0370247 A1 Dec. 18, 2014

Related U.S. Application Data

(60) Provisional application No. 61/605,387, filed on Mar. 1, 2012.

(51) Int. Cl.
| | | |
|---|---|---|
| *B32B 3/20* | (2006.01) | |
| *B23K 26/18* | (2006.01) | |
| *B41M 5/26* | (2006.01) | |
| *B23K 26/00* | (2014.01) | |
| *B05D 5/00* | (2006.01) | |
| *G03F 7/004* | (2006.01) | |
| *G03F 7/20* | (2006.01) | |

(52) U.S. Cl.
CPC . *B23K 26/18* (2013.01); *B05D 5/00* (2013.01); *B23K 26/0066* (2013.01); *B41M 5/26* (2013.01); *G03F 7/0042* (2013.01); *G03F 7/20* (2013.01); *Y10T 428/24802* (2015.01)

(58) Field of Classification Search
CPC ........... Y10T 428/24802; B23K 26/18; B23K 26/0066; G03F 7/0042; G03F 7/20; B41M 5/26
See application file for complete search history.

(56) References Cited

U.S. PATENT DOCUMENTS

| | | |
|---|---|---|
| 6,171,383 B1 | 1/2001 | Sakoske et al. |
| 6,221,147 B1 | 4/2001 | Sakoske et al. |
| 6,238,847 B1 | 5/2001 | Axtell, III et al. |
| 6,416,868 B1 | 7/2002 | Sullivan et al. |
| 6,485,557 B1 | 11/2002 | Swiler |
| 6,503,310 B1 | 1/2003 | Sullivan |
| 6,503,316 B1 | 1/2003 | Sakoske et al. |
| 6,541,112 B1 | 4/2003 | Swiler et al. |
| 6,582,814 B2 | 6/2003 | Swiler et al. |
| 6,680,121 B2 | 1/2004 | Sakoske et al. |
| 6,924,077 B2 | 8/2005 | Delp et al. |
| 7,485,403 B2 | 2/2009 | Khan |
| 8,642,504 B2 | 2/2014 | Campbell et al. |
| 8,765,855 B2 | 7/2014 | Thaker |
| 9,034,089 B2 | 5/2015 | Jarvis et al. |
| 2003/0180660 A1* | 9/2003 | Khan ......................... 430/270.1 |
| 2005/0269304 A1 | 12/2005 | Khan et al. |
| 2007/0218256 A1* | 9/2007 | Tani ........................... 428/195.1 |
| 2008/0311311 A1* | 12/2008 | Khan et al. ..................... 427/554 |
| 2012/0103545 A1* | 5/2012 | Rancien ....................... 162/140 |
| 2012/0213943 A1 | 8/2012 | Sarver et al. |

FOREIGN PATENT DOCUMENTS

| | | |
|---|---|---|
| EP | 1110660 | 6/2001 |
| GB | 2447659 A | 9/2008 |
| WO | 2014/025539 A1 | 2/2014 |

OTHER PUBLICATIONS

International Search Report for corresponding PCT/US2013/028760 mailed Jul. 4, 2013, one page.
"DataLase and Ferro Collaborate to Develop Laser-Markable Aerosol," PCI Mag., Feb. 1, 2007, one page.
"Cermark made of what?", Engraving Etc. blog entries dated May 12-14, 2006, seven pages.
"Any success with Thermark with the 40w?", Full Spectrum Engineering Message Board posts dated Jun. 23-27, 2011, four pages.
M. Carter Brown Message Board forum Airsmiths MCB, "Laser Engraver" posts dated Jul. 8-14, 2012, eight pages.

* cited by examiner

*Primary Examiner* — Elizabeth Mulvaney
(74) *Attorney, Agent, or Firm* — Rankin, Hill & Clark LLP

(57) ABSTRACT

Various laser marking compositions and related methods are described. The laser marking compositions include a molybdenum metal complex, a tungsten metal complex, or combinations thereof. Marks or other indicia formed on a substrate using the compositions and methods exhibit increased contrast and improved substrate bonding.

18 Claims, No Drawings

LASER ABSORBING COMPOUNDS

FIELD

The present subject matter relates to compounds for use in laser marking operations and various methods of laser marking using such compounds. The present subject matter also relates to articles marked using the noted compositions and/or methods.

BACKGROUND

Laser marking is a marking technique that uses lasers and other forms of radiant energy to bond a marking substance to a wide range of substrates. Laser marking forms permanent marks on metals, glass and ceramic parts and is used in many applications, ranging from aerospace to awards and engraving industries. Laser marking differs from the more widely known techniques of laser engraving and laser ablation in that laser marking is an additive process, adding material to the substrate to form the marking instead of removing material as in engraving and ablation techniques.

For metal substrates, parts can be permanently marked with high contrast, high resolution marks for logos, bar-coding, and identification and serialization purposes without damage to the substrate. With glass and ceramics the traditional firing process is replaced with a laser and marking composition. Complex glass and ceramic surfaces can be decorated or marked in seconds to form a permanent bond between the composition and the surface.

A need remains for marks that exhibit increased contrast and marks that are more readily visible. In addition, for marks subject to surface wear, scuffing, or exposure to environmental factors, it would also be beneficial to improve bonding between the mark and the underlying substrate to prevent or reduce the potential for abrasion or removal of the mark. Accordingly, in view of these and other concerns, a need exists for improved marking compositions and methods using such materials.

SUMMARY

The difficulties and drawbacks associated with previously known materials and practices are addressed in the present compositions and methods for laser marking.

In one aspect of the present subject matter, laser marking compositions are provided that produce high contrast marks and comprise a vehicle and a laser absorber. The laser absorber comprises a metal complex selected from the group consisting of a molybdenum metal complex, a tungsten metal complex, and combinations thereof.

In another aspect of the present subject matter, method of forming a mark on a substrate is provided. The method comprises applying a marking composition to a substrate. The marking compositions include a vehicle and a laser absorber. The laser absorber comprises a metal complex selected from the group consisting of a molybdenum metal complex, a tungsten metal complex, and combinations thereof. The method further comprises exposing the marking composition to a laser such that at least a portion of the marking composition increases in temperature, adheres to the substrate, and forms a mark on the substrate that has a luminance, color, and/or degree of opacity that contrasts from the substrate.

In another aspect of the present subject matter, a substrate having a mark is provided. The mark on the substrate is formed by lasing a marking composition disposed on the substrate. The marking composition comprises a vehicle and a laser absorber. The laser absorber comprises a metal complex selected from the group consisting of a molybdenum metal complex, a tungsten metal complex, and combinations thereof.

As will be realized, the present subject matter is capable of other and different embodiments and its several details are capable of modifications in various respects, all without departing from the present subject matter. Accordingly, the drawings and description are to be regarded as illustrative and not restrictive.

DETAILED DESCRIPTION OF THE EMBODIMENTS

The present subject matter provides various marking compositions, methods, and articles marked using the noted compounds and methods. The marking compositions comprise a laser absorber comprising one or more specific compounds. In accordance with the present subject matter, it has been discovered that certain aspects of the resulting marks can be significantly improved or enhanced by selection and use of these specific compounds.

The present invention provides a class of compounds that can be used to formulate laser marking material systems that display improved laser absorbing properties and marking capabilities. Use of the compounds in marking material systems yields higher contrasting marks on a variety of surfaces including metal substrates. Upon exposure to laser energy, marking material systems made in accordance with the present invention form a permanent mark on the substrate to which they have been applied. These and other advantages and benefits are described in greater detail herein.

Marking Compositions

As used herein, the term "marking composition" means a composition that can be disposed on a portion of a substrate and after the composition has been irradiated by a laser, provides a high contrasting mark on the substrate. The resultant mark contrasts with the non-irradiated region of the substrate, e.g., the marking may have a different luminance/lightness value and/or color value on the Hunter Lab scale as compared with the non-irradiated region.

In the Hunter Lab scale, also CIELAB scale (so named for the variables L, a, and b), L measures luminance or lightness and varies from 100 for perfect white to zero for black, approximately as the eye would evaluate it, where DL=L (sample)−L (standard). If DL (or $\Delta L$) is positive, the sample is lighter than the standard. If DL is negative, the sample is darker than the standard.

The chromaticity dimensions (a and b) give understandable designations of color. The a dimension measures redness when positive, gray when zero, and greenness when negative, where Da=a(sample)−a(standard). If Da (or $\Delta a$) is positive, the sample is redder than the standard. If da is negative, the sample is greener than the standard.

The b dimension measures yellowness when positive, gray when zero, and blueness when negative, where Db=b (sample)−b(standard). If Db (or $\Delta b$) is positive, the sample is yellower than the standard. If Db is negative, the sample is bluer than the standard.

The Hunter total color difference (DE or $\Delta E$) for any illuminant or observer is calculated as $\Delta E = \sqrt{(\Delta L^2 + \Delta a^2 + \Delta b^2)}$.

In one embodiment of the present subject matter, the marking composition preferably provides contrasting marks having different lightness values (L) as compared with the substrate lightness value (L), providing a lightness value difference (ΔL) between that of the substrate and that of the irradiated marking composition as determined by the standard CIELAB scale. In another embodiment, the marking compositions preferably provide contrasting marks having different color values (a and b) than the substrate. In still another embodiment, the marking compositions preferably provide optimum color characteristics having certain degrees of opaqueness to cover the marked portion of the substrate and provided contrast with the remaining non-marked portion of the substrate. In yet another embodiment, the marking compositions provided lightness values, color values, degrees of transparency, translucence, opacity, and combinations thereof to provide contrast from the unmarked portion of the substrate.

The resulting laser markings made in accordance with the present subject matter may need to be opaque for one application, while another application may require transparency or translucency to show a certain effect on the substrate. The difference in lightness values (ΔL) between the marked and unmarked regions typically has an absolute value of greater than about 10. Preferably, the absolute value of ΔL is greater than about 20, more preferably greater than about 25. In a particularly preferred embodiment, the absolute value of ΔL is about 30 or higher. The laser markings made in accordance with the present subject matter and corresponding L, a, and b values for those markings are measured with a spectrophotometer.

The opacity or opaqueness of a marking composition can be measured with a spectrophotometer over a black and white Leneta card. Preferably, the contrast measured over black and then white Leneta backgrounds for the opacity of marking compositions is from about 1 ΔE to about 5 ΔE and most preferably from about 0.5 ΔE to about 2 ΔE.

The preferred embodiment marking compositions generally comprise (i) particles of one or more laser absorbers, (ii) a vehicle or solvent, and (iii) one or more optional additives. The preferred embodiment compositions are not limited to (i), (ii), and (iii), and can include additional components.

The marking compositions made in accordance with the present subject matter can be formulated in ways that makes them suitable for one of many application techniques depending upon the particular requirements of the final marking process. For example, the marking compositions may be formulated into a powder, a tape, or a liquid medium. The marking compositions can be applied via a variety of means including but not limited to screen printing, spraying and electronic deposition using such application techniques as ink jet and valve jet application.

Preparation of the marking composition in liquid form can, for example, occur through low shear mechanical mixing, high shear mechanical mixing, ultrasonic mixing, and/or milling, or the like.

Depending upon the type of application technique, the components of the marking compositions will vary. Below in Table 1 are illustrative examples of the range of components employed for a marking composition in accord with the present subject matter.

TABLE 1

Range of Components and Typical Weight Percentages
For Marking Compositions

| Component | Typical Weight Percent |
| --- | --- |
| Vehicle (Typically Water and/or Alcohol) | 30% to 60% |
| Glass Frit or Frit Precursor | 5% to 45% |

TABLE 1-continued

Range of Components and Typical Weight Percentages
For Marking Compositions

| Component | Typical Weight Percent |
| --- | --- |
| Resin Binder | 0.25% to 5% |
| Laser Absorber | 1% to 25% |
| Dispersant/Surfactant | 0% to 5% |
| Silicate minerals | 0% to 10% |

Variations from these typical weight percentages are within the scope of the present subject matter. For example, if a tape is being produced, the marking composition may comprise a considerable amount of binder, for example, 50% by weight. However, if a powder is being formed, such powder may be free of binder. Similarly, if a liquid application technique is being used, a considerable amount of vehicle may be utilized, whereas with a powder, little or no carrier would be employed. Variations from the typical weight percentage of components will arise also depending on the substrate to which the marking composition is applied. This is outlined in more detail herein where marking compositions by substrate type are discussed.

Vehicle

In accordance with the present subject matter, the marking compositions comprise a vehicle for transferring the laser absorber to a substrate. Preferably, the vehicle comprises water or other aqueous-based liquids, and/or one or more organic solvents. In one embodiment, the vehicle comprises water. In one aspect, the water is purified water. Examples of suitable types of purified water include but are not limited to distilled water and de-ionized water.

In another embodiment, the vehicle comprises an organic solvent(s). Non-limiting examples of organic solvents used in the vehicle in accordance with the present subject matter include ethanol, ketones, alkanes such as butane (in liquid form resulting from pressurization and used for spray applications), and aromatic organic solvents such as xylenes.

In accordance with the present subject matter, the marking compositions may also include vehicles such as polyols, chlorinated solvents, amines, esters, glycol ethers, terpenes, petroleum naphthas, aromatic hydrocarbons, and natural oils. By natural oils it is meant oils derived from plants. Other suitable carriers include furans, isoparaffins, N,N dimethylformamide, dimethylsulfoxide and tributylphosphine.

Glass Frit or Frit Precursor

In accordance with the present subject matter, the marking composition may comprise glass frit such as lead frit or lead-free frit. As used herein, the term "glass frit" means pre-fused glass material which is typically produced by rapid solidification of molten material followed by grinding or milling to the desired powder size. Finely ground glass materials are suitable for marking glass or ceramic substrates.

In accordance with the present subject matter, glass frits generally are composed of alkali metal oxides, alkaline earth metal oxides, silica, boron oxide and transition metal oxides. Preferred glass frits may comprise from 0 to about 75 weight percent lead oxide, from 0 to about 75 weight percent bismuth oxide, from 0 to about 75 weight percent silica, from 0 to about 50 weight percent zinc oxide, from 0 to about 40 weight percent boron oxide, from 0 to about 15 weight percent aluminum oxide, from 0 to about 15 weight percent zirconium oxide, from 0 to about 8 weight percent titanium oxide, from 0 to about 20 weight percent phosphorous oxide, from 0 to about 15 weight percent calcium oxide, from 0 to about 10 weight percent manganese oxide, from 0 to about 7 weight percent copper oxide, from 0 to about 5 weight percent cobalt oxide, from 0 to about 15 weight percent iron oxide, from 0 to about 20 weight percent sodium oxide, from 0 to about 20 weight percent potassium oxide, from 0 to about 15 weight percent lithium oxide and from 0 to about 7 weight percent fluoride, as well as other oxides conventionally used in glass frit compositions.

In addition to glass frit, precursors of such glass frit materials may be used for the marking compositions. Examples of glass frit precursors include metal oxides with glass formers, such as silica, zinc oxide, bismuth oxide, sodium borate, sodium carbonate, feldspars, fluorides, and the like.

Resin Binder

The marking compositions of the present subject matter may comprise an amount of binder materials to improve rheological properties, green strength, or package stability for the compositions. Binders may include epoxies, polyesters, acrylics, methacrylics, cellulosics, vinyls, natural proteins, styrenes, polyalkyls, carbonates, rosins, rosin esters, alkyls, drying oils, and polysaccharides such as starches, guar, dextrins and alginates, and the like.

Laser Absorber

Laser Absorber, as used herein, refers to a composition that absorbs radiant energy and bonds with the substrate to form a mark having a luminance, color value, or degrees of opacity that provide visual contrast with the substrate. In one embodiment, the laser absorber is in particulate form and is combined with the other components to form the marking compounds.

The laser absorber of the present subject matter is a single or mixed metal complex selected from the group consisting of molybdenum metal complexes, tungsten metal complexes, and combinations thereof. In one aspect, various molybdate metal complexes, various tungstate metal complexes, and combinations thereof are utilized in the laser absorber.

Examples of suitable molybdenum metal complexes for use in the present invention include Tungsten Molybdate, Zinc Molybdate, Ammonium Molybdate, Sodium Molybdate, Strontium Molybdate, Barium Molybdate, Cobalt Molybdate, Copper Molybdate, Iron Molybdate, Magnesium Molybdate, Manganese Molybdate, Potassium Molybdate, Praseodymium Molybdate, Cerium Molybdate, Calcium Molybdate, Molybdenum Carbide, Nickel Molybdate, Niobium Molybdate, Bismuth Molybdate, Zirconium Molybdate, Molybdenum Oxide, Lithium Molybdate, Lanthanum Molybdate, Tin Cobalt Molybdate, Cobalt Molybdenum Oxide, and Magnesium Cobalt Molybdenum Oxide, as non-limiting examples. In one aspect, a Cobalt Molybdenum Oxide is used in the laser absorber with a formula $Co_xMo_yO_z$, having an atomic percentage wherein x=15.38-26.93, y=16.67-43.83, and z=29.24-66.67.

Further, tungsten metal complexes can be suitably used in the present invention including Molybdenum Tungstate, Zinc Tungstate, Ammonium Tungstate, Sodium Tungstate, Strontium Tungstate, Barium Tungstate, Cobalt Tungstate, Copper Tungstate, Iron Tungstate, Magnesium Tungstate, Manganese Tungstate, Potassium Tungstate, Praseodymium Tungstate, Cerium Tungstate, Calcium Tungstate, Tungsten Carbide, Nickel Tungstate, Niobium Tungstate, Bismuth Tungstate, Zirconium Tungstate, Tungsten Oxide, Lithium Tungstate, Lanthanum Tungstate, Tin Cobalt Tungstate, Cobalt Tungsten Oxide, and Magnesium Cobalt Tungsten Oxide as non-limiting examples. In one aspect, a Cobalt Tungsten Oxide is used in the laser absorber with a formula $Co_xW_yO_z$, having an atomic percentage wherein x=16.67, y=16.67, and z=66.67.

In one embodiment, mixed metal oxide complexes are used to form stable laser absorber compositions that produce permanent, high contrast laser marks on metals (in particular), glass, ceramic, and plastic substrates. In one aspect, the laser absorber comprises one, or a combination of the following Molybdenum-Tungsten mixed metal oxides complexes:

TABLE 2

Mixed Molybdenum-Tungsten Metal Oxide Complexes

| Compound | Formula | Crystal Structure | Reference |
|---|---|---|---|
| Molybdenum Tungsten Oxide | $(Mo_{0.86}W_{0.14})_{10}O_{29}$ | Monoclinic | ACSAA4, Vol 9, page 1382, (1955) primary reference: Magnelli et al. |
| Molybdenum Tungsten Oxide | $(Mo_{0.68}W_{0.32})_{12}O_{35}$ | Monoclinic | ACSAA4, Vol 9, page 1382, (1955) primary reference: Magnelli et al. |
| Molybdenum Tungsten Oxide | $(Mo_{1-x}W_x)O_3$ wherein x = 0.35 to 0.85 | Not assigned | CHDCAQ, Vol 276, page 499, (1973) primary reference: Gloeikler, Gleitzer |
| Tungsten Molybdenum Oxide | $(W_{0.4}Mo_{0.6})O_3$ | Orthorhombic | JSSCBI, volume 25, page 239, (1978) primary reference: Saljie, E. et al |
| Tungsten Molybdenum Oxide | $(W_{0.53}Mo_{0.47})O_3$ | Monoclinic | JSSCBI, volume 25, page 239, (1978) primary reference: Saljie, E. et al |
| Molybdenum Tungsten Oxide | $(Mo_{0.3}W_{0.7})O_{2.765}$ | Orthorhombic | JSSCBI, Vol 40, page 75, (1981) primary reference: Ekstrom, T. et al. |

In another aspect, the laser absorber comprises a eutectic composition comprising $MoO_3$ and $WO_3$. A eutectic composition is a composition of two or more components at a particular ratio that has a lower melting temperature than any other ratio combination of those components. In the present subject matter, a eutectic composition of $MoO_3$ and $WO_3$ has a lower melting temperature than any other ratio combination of $MoO_3$ and $WO_3$. Any other composition having a different ratio of $MoO_3$ to $WO_3$ thus by definition, has a higher melting temperature than the eutectic composition of $MoO_3$ and $WO_3$. In this aspect, the laser absorber includes the eutectic composition of $MoO_3$ and $WO_3$ for use in a laser marking composition. Without being bound to any particular theory, it is believed that lasing a marking composition having a laser absorber comprising a eutectic composition creates a more durable, more highly contrasting mark on a substrate than when using a non-eutectic composition.

In another aspect, the laser absorber comprises a eutectic composition of either or both of $MoO_3$ and $WO_3$ combined with $Li_2O$, $Na_2O$, and/or $K_2O$. The addition of $Li_2O$, $Na_2O$, and/or $K_2O$ to either of $MoO_3$ and $WO_3$ is used to create a eutectic composition to improve the durability and contrast of a laser mark on metal, ceramic, glass, and plastic substrates.

In another aspect, the separate eutectic $MoO_3$ and $WO_3$ compounds can be combined to form eutectic compositions of mixed metal molybdenum and tungsten complexes. For example, $Li_2MoO_4$ can be combined with $K_2MoO_4$ at specific ratios to produce a laser absorber having a eutectic temperature.

In another aspect, the particulate laser absorber comprises tungsten oxide combined with SrO and/or $Nb_2O_5$. For example, the laser absorber can comprise combinations of $SrO+Sr_3WO_6$, $Sr_3WO_6+SrWO_4$, $SrWO_4+WO_3$, or $Nb_2O_5+WO_3$. At a certain molar ratio, these modifications to tungsten oxide can increase the melting temperature of the resulting composition over that of tungsten oxide alone. This adjustment to tungsten oxide may be of interest in high-temperature and special alloy substrate marking requiring a laser absorber having a higher melting point.

In accordance with the present subject matter, the laser absorbers may comprise any of a number of molybdenum and tungsten metal complexes of the present subject matter, either singularly or in combination. The laser absorber may further comprise other additional components including complex inorganic compounds, zirconium compounds, silicon compounds, calcium compounds, other molybdenum compounds, other tungsten compounds, vanadium compounds, bismuth containing oxide compounds, metal oxides, metal compounds, inorganic pigments, inorganic pigment precursors, and combinations thereof.

Non-limiting examples of metal oxides include cobalt oxide, iron oxide, aluminum oxide, chromium oxide, lead oxide, lead chromium oxide, lead sulfur oxide, bismuth vanadium oxide, manganese iron oxide, titanium oxide, and the like. Non-limiting examples of metal compounds include copper compounds, silver compounds, gold compounds, and the like. Non-limiting examples of inorganic pigments include cobalt aluminates, carbon black, stannic sulfide, cadmium selenide, and the like. Non-limiting examples of complex inorganic compounds include inorganic pigments and oxides. Non-limiting examples of zirconium compounds include zirconium silicates-oxides. Non-limiting examples of silicon compounds include phyllosilicate minerals.

The laser absorber particles of the present subject matter have particular size characteristics. More specifically, various size ranges are noted for the average particle size of particles in the various embodiments. In describing the size characteristics, particles are described in terms of average or mean size (i.e. $D_{50}$). The size of a particle is the maximum span of a particle. For particles that are spherical in shape, the maximum span is the diameter of the particle. However, it will be understood that the particles may be in a variety of different shapes besides spherical. Non-limiting examples of particle shapes include flake or leaf shaped, oblong, triclinic, monoclinic, isomeric, tetragonal, hexagonal, trigonal, cubic, polymorphic, or other shapes. And so, for non-spherical particles, their maximum span is the maximum distance from one location on the particle. The maximum distance is typically measured through the particle as this is a straight line distance.

In many of the compositions described herein, multiple populations of laser absorber particles are provided. For example, a marking composition may include a first particulate material, a second particulate material, and still additional particulate materials. In the examples described herein, an average or mean particle size of multiple populations of particles is referenced.

The present subject matter provides for laser absorber particle sizes that are optimized to provide high contrast with the substrate to which they are applied. Also provided are particle sizes to optimize surface bonding between the marking composition and the substrate. This optimization results in a more durable bond between the marking compositions and the substrate after the marking compositions are irradiated with a laser. An additional benefit of optimizing particle size is provided to improve dispersion characteristics of particles in the marking compositions. This provides for longer shelf-life of a marking composition and reduces agglomeration, sedimentation, aggregation, flocculation, or the like.

The size of the absorber particles can be adjusted in any number of ways well known in the art including grinding, pulverizing, hammering, milling and the like that can be accomplished with horizontal mills, paint shakers, ball mills and the like.

In one embodiment the present subject matter provides for marking compositions with the laser absorber comprising particles with an average particle size ($D_{50}$) from about 0.1 microns to about 55 microns. That is, for $O_{50}$=55 microns, half the particles are larger than 55 microns and half are smaller than 55 microns. The optimum particle size varies from compound to compound. The formulation, whether for metal, glass, ceramic has an effect on optimum particle size. The laser itself has an effect on the optimum particle size due to the absorption properties of each compound.

In another embodiment the present subject matter provides for marking compositions with the laser absorber comprising particles with an average particle size ($D_{50}$) from about 25 microns to about 50 microns.

The metal complexes used in the laser absorber may be produced in a variety of ways including by calcination or by wet reaction methods. Metal complexes produced by both of these methods provide high contrast laser marks on various substrates, in particular metal substrates, when used in a marking composition of the present subject matter.

Non-limiting examples of specific metal complexes that can be made by calcination or wet chemistry reactions, and used in the laser absorber, are as follows:

$$ZnCO_3+MoO_3 \rightarrow ZnMoO_4+CO_2$$

$$2NaOH+MoO_3 \rightarrow Na_2MoO_4+H_2O$$

$$CaCO_3+MoO_3 \rightarrow CaMoO_4+CO_2$$

$$SrCO_3+MoO_3 \rightarrow SrMoO_4+CO_2.$$

Dispersant/Surfactant

Surfactants or dispersants coat the laser absorber particles to aid in producing specific particle sizes and inhibiting coalescing or clumping of the particles in the marking compositions. If the particles are subjected to a particle size reduction operation, the dispersant can be added during the operation to inhibit the particles from aggregating together to form larger bodies.

Examples of surfactant/dispersants include but are not limited to Nuosperse AQ-200 supplied by Elementis Specialties, Inc., 469 Old Trenton Road, East Windsor, N.J. 08512 or other hydrophobic humectant with water resistant and scrub resistant properties can be used. Generally, any surface active dispersant, silicon based dispersant, etc., may be suitable for use in the marking compositions. Non-polymeric and polymeric surface active dispersants, surfactants or agents can be incorporated into the formula.

Silicate Mineral

In addition to other components, a silicate mineral(s) is optionally added to the marking compositions to adjust the rheological properties of the marking compositions and to provide durability for the laser markings. Non-limiting examples of silicate minerals that can be used in accordance with the present subject matter include phyllosilicates selected from the serpentine group (i.e. Antigorite, Chrysotile, Lizardite and the like) the clay mineral group (i.e. Halloysite, Kaolinite, Illite, Montmorillonite, Vermiculite, Talc, Palygorskite, Sepiolite, Pyrophyllite and the like) the mica group (i.e., Biotite, Muscovite, Phlogopite, Lepidolite, Margarite, Glauconite and the like) and the chlorite group (i.e. Baileychlore, Chamosite, Clinochlore, Cookeite, Donbassite, Gonyerite, Nimite Odinite, Orthochamosite, Pennantite, Ripidolite, Sudoite). Other suitable silicate minerals that can be used include sorosilicates, cyclosilicates, nesosilicates or orthosilicates, inosilicates, and tectosilicates.

Additional Components

The marking compositions may optionally include additives to improve various characteristics of the marking compositions either before or after lasing. For example, additives can be added to improve bonding, dispersability, wetting, flow, rheology and the appearance of the mark. Additives can also be added to relieve surface defects and thermal stresses of the mark The present subject matter marking compositions incorporate these additional components depending on the intended application. Non-limiting examples of typical additives include coloring agents, viscosity adjusting agents, thermal expansion modifiers, flow controllers, stabilizers, co-solvents such as alcohols, and clarity promoters to promote maintenance of optical characteristics of the marking compositions. As noted, the use of one or more additives in the marking composition(s) is optional.

In one embodiment, metal powder can be added to the marking compositions to reduce thermal expansion differences between the laser mark and substrate. Normally, differences in thermal expansion of the laser mark and the substrate create a level of residual stress at the substrate/mark interface. This stress can lead to cracking and failure or life reduction of the mark. In one embodiment, a laser marking composition comprising metal powder can be tailored to have a thermal expansion/contraction coefficient more closely matched to that of the substrate. The metal powder can comprise alloys with certain mole ratio of different metals, tailored specifically for the type and composition of the substrate, and the range of expected temperatures to which the substrate will be exposed during its useful life.

In one embodiment, the marking composition comprises a powdered alloy of molybdenum metal and tungsten metal. The alloy is capable of creating stable solutions that when incorporated in the marking composition, yield laser marks with improved contrast and marks that better match differential thermal expansions on various substrates. Such alloy metal powders are capable of mixtures with the laser absorber or complexes mentioned above, and along with other compounds, help inhibit oxidation during the lasing process. The expansion coefficient of the resulting marks more closely matches the rate of expansion for the substrate than without the alloy. Since each substrate has an individual rate of thermal expansion/contraction and thermal history, the ratio of molybdenum and tungsten can be tailored to closely approximate the particular substrate. For example, a higher percentage of tungsten will reduce the rate of thermal expansion of the alloy. Therefore, stress resulting from variations in the rates of thermal expansion/contraction between these materials is minimized and a longer lived mark is produced.

In one aspect, the marking composition comprises an alloy of about 70 wt % molybdenum and about 30 wt % tungsten for use as a thermal expansion modifier to reduce thermal stress at the substrate/mark interface.

A further advantage of adding the molybdenum and tungsten alloy thermal expansion modifier is the reduced tendency for oxidation of the mark. Oxidation of the mark can have a negative impact on the durability and longevity of the mark. Tungsten oxide is more stable than molybdenum oxide and thus, the addition of tungsten to the molybdenum elevates the oxidation resistance of the entire mark. By this addition, the occurrence of oxidation of the mark during lasing and thereafter is inhibited. By inhibiting oxidation of the laser mark and reducing the difference in thermal expansion between the mark and the substrate, a more durable mark is produced.

Marking Compositions by Substrate Type

The marking compositions can be classified according to the type of substrate to be laser marked. That is, one preferred type of composition is a glass marking composition. Another preferred composition is a ceramic marking composition. Yet, another preferred composition is a metal marking composition.

In glass marking applications in accordance with the present subject matter, opacity, color values (a and b) and contrast in luminance (L value) of the mark from the substrate are all properties of the mark that are considered in accordance with the present subject matter. The application will dictate whether opacity, color, luminance contrast or combinations of these properties are important. For laser marking on certain glass substrates the resulting mark may need to be opaque for one application, while another glass application may require transparency or translucency when laser marked to show a certain effect through the glass. Generally, the glass marking compositions utilize (i) a laser absorber comprising one or more populations of particles, (ii) a vehicle, and (iii) glass frit. The glass marking composition comprises a laser absorber from about 5 wt % to about 60 wt %, glass frit from about 5 wt % to about 55 wt %, and a vehicle from about 10 wt % to about 55 wt %.

In ceramic marking applications in accordance with the present subject matter, opacity and the color values (a and b) have more affect on the contrast of the mark from the substrate than does the lightness (L) value of the mark. This is due to the mark becoming more opaque and masking the ceramic substrate. The ceramic marking compositions generally utilize (i) a laser absorber comprising one or more populations of particles, (ii) a vehicle, and (iii) glass frit. The ceramic marking composition comprises a laser absorber from about 5 wt % to about 60 wt %, glass frit from about 5 wt % to about 55 wt %, and a vehicle from about 10 wt % to about 55 wt %.

In metal marking applications, the metal marking compositions utilize (i) a laser absorber comprising one or more populations of particles, and (ii) a vehicle. The metal marking composition comprises a laser absorber from about 5 wt % to about 60 wt %, and a vehicle from about 5 wt % to about 65 wt %.

In the previously described glass marking compositions, ceramic marking compositions, and metal marking compositions; one or more populations of absorber particles are used. Additionally, other components can be added to any of the marking compositions as desired.

METHODS

Included in the present subject matter are methods of laser marking a substrate with the marking compositions as disclosed herein. Generally, the method comprises applying the marking composition to a substrate, bonding the marking composition to the substrate, and removing the excess, unbonded marking composition from the substrate.

In accordance with the present subject matter, a selected portion of the marking material is permanently adhered to the substrate upon laser irradiation. As used herein, the term "adhere" is used to designate any permanent means of bonding the irradiated marking material to the substrate. For example, the irradiated marking material may be adhered to the surface of the substrate using the laser, wherein the laser irradiation sinters the marking material to the substrate, fuses the marking material to the surface of the substrate, diffuses at least a portion of the marking material into the substrate, causes a chemical or physical reaction in the marking material or between the marking material and the substrate, or the like.

As used herein, the term "permanent marking" means a non-temporary marking which, for example, possesses relatively high wear resistance, corrosion resistance and/or fading resistance. While not being bound to any particular theory, it is believed that the interaction of the radiant energy and the marking material results in an inert coating that is mechanically and chemically bonded to the substrate material. The marking layer is believed to form covalent bonds with the substrate material, and it is believed this chemical bond exceeds the strength of the mechanical bond.

Upon bonding of the marking composition to the substrate by exposure to laser irradiation, the marking composition is fused to the substrate to produce a laser mark that, in most cases, is as durable as the substrate itself. In the marking methods, mark quality depends on a variety of factors, including the substrate used, marking speed, laser spot size, beam overlap, marking material thickness, and laser parameters.

Use of additional or combinations of different marking composition, subsequent applications of marking composition, and/or the adjustment of laser parameters will result in variations in the durability, appearance, and structural form of the resulting mark. Thus, a person skilled in the art of laser marking can create a wide variety of marking characteristics to suit his requirements. All of these marking characteristics can be achieved with the use of a single low-power, low-cost air-cooled diode laser. Furthermore, a variety of colors can be achieved.

The methods of laser marking a substrate utilize marking compositions which include a laser absorber comprising one or more molybdenum metal complexes, one or more tungsten metal complexes, or combinations thereof, as disclosed herein.

Application

Application techniques for coating the marking composition to the substrate are not particularly limited. The present subject matter marking compositions can be disposed on a substrate by different means depending on the requirements for different applications. The characteristics of the laser markings can be tailored in part by altering the components of the marking compositions and in part by selecting the appropriate means or media for applying the marking compositions to a substrate. The marking compositions may be applied to the substrate by various methods including brush on techniques, masking, dosing, deposition, dispensing, coating, metering, painting, spraying, pad printing, screen printing, roll coating, tape, and others.

Marking compositions are typically applied to the substrate with an average thickness of at least about 0.1 micron. In one aspect, the marking compositions are applied in an average thickness from about 1 to about 300 microns. In another aspect, the marking compositions are applied in an average thickness from about 5 to about 200 microns. In still another aspect, the marking compositions are applied in an average thickness from about 10 to about 100 microns. In another embodiment, the average thickness can be 10 to 40 microns, or 30 to 70 microns, or 60 to 100 microns.

The average thickness of the resulting coating of marking material can be adjusted and/or controlled by the use of viscosity agents in the material, by the control of temperature before, during, and after application, and by using optional treatments or pre-coatings on the surface to be marked. Depending upon the concentration of the laser absorber in the marking composition, and other factors, adjustment of the average coating thickness can be used to at least partially control contrast or darkness of the laser marks. Typically, average thickness of the coating will vary depending upon coating chemistry and heat stability.

In accordance with the present subject matter, the marking compositions can be in both solid and liquid form. In one aspect, the present subject matter comprises a solid marking composition in the form of a powder. Marking compositions in powder form can be brought into contact with the substrate surface at the desired average thickness by solvent-less powder deposition, dispensing, coating, metering, dosing, masking, painting or the like.

In another embodiment, the present subject matter comprises a marking composition in the form of a liquid. Water based media are used in one aspect because of their minimal environmental impact. In another aspect, solvent based media are used to control drying rate and dispersion or moisture sensitivity of certain components of the laser absorber. In accordance with another aspect, sol gel materials may be used to apply the marking material to the substrate. Where dispersions are used, the applied layer can be dried prior to the irradiation step, however this is not necessary. The marking material in liquid form can be applied onto the substrate surface by various methods such as screen printing, painting, flood coating, brushing, spraying, roll coating, dipping, flow coating, electrostatic application and doctor blading.

In one aspect of the present subject matter, marking compositions in liquid form are formulated into a coating composition which is coated onto a carrier surface. The carrier transfers the marking composition to the surface of a substrate to be laser marked. In this aspect, the marking composition can, for example, be in the form of a pressure sensitive adhesive formulation. Alternatively, the marking composition can be incorporated into a flexible polymer film carrier, which can be polyester, polyethylene, or polypropylene for example.

These compositions can then be incorporated into a tape and/or label to be disposed on a portion of a substrate. This tape can be in the form of pressure sensitive, self-adhesive labels or a non-adhesive tape pressed against the substrate surface. The tape can be transparent, opaque, or translucent. The label and tape fabrication promote proper and substantially uniform average thickness of the marking composition when brought into contact with the substrate surface. Suitable carriers for this type of application strategy are, for example, paper and flexible plastic films such as polyester, polyethylene, and polypropylene films. It is not necessary that a tape or adhesive-carrying film be used. It is also contemplated that nearly any single or multiple film could be used as a carrier for a marking composition so long as the film does not interfere with the marking composition upon application thereto, and laser energy can penetrate the thickness of the film to reach the marking composition and cause marking on the surface of interest.

Additional materials used in the application of the marking composition in liquid form or in the fabrication of tape and/or labels are substantially vaporized and vented away from the substrate. A laminar air flow across the surface of the substrate can be created by venting and/or exhausting equipment to insure a consistent localized environment in which the process can occur.

In another preferred aspect, marking materials are dispersed in high temperature waxes or polymers and applied to a portion of a substrate from a hot melt or by rubbing the surface of the substrate with such material.

Bonding

After the marking material is applied to the surface of the substrate, a selected portion of the marking material coating is irradiated with a laser to adhere the irradiated marking material to the substrate and to form a permanent marking thereon. For many types of markings, the selected portion of the marking material to be irradiated may comprise from about 1 to about 99 percent of the total surface area of the coating layer of marking material, typically from about 5 to about 95 percent. A laser is preferably used to selectively irradiate the marking material. However, other forms of focused energy may be used in accordance with the present subject matter. Irradiation may be achieved by moving a laser beam over a stationary substrate using conventional beam steering methods, by moving the substrate in relation to the laser beam and/or by masking the substrate. Laser irradiation is typically achieved by directing the beam directly against the layer of marking material, but may also be achieved by directing the beam through a sufficiently transparent substrate.

A wide array of lasers can be used for the present subject matter. Suitable lasers are those known as $CO_2$ lasers and fiber lasers.

A $CO_2$ laser produces a beam of infrared light with the principal wavelength bands centering around 9.4 and 10.6 micrometers. $CO_2$ lasers are available commercially from numerous sources. One suitable $CO_2$ laser is a 35 watt $CO_2$ laser with about 9.2 micron to about 11.4 micron wavelength.

A fiber laser is a laser in which the active gain medium is an optical fiber doped with rare-earth elements such as erbium, ytterbium, neodymium, dysprosium, praseodymium, and thulium. They are related to doped fiber amplifiers, which provide light amplification without lasing. Fiber lasers are also commercially available from numerous sources. A suitable fiber laser for use in the present laser marking methods is a 10 watt non-pulsed fiber laser with about 904 nm to about 1065 nm wavelength.

Generally, the intensity of the laser and the particular wavelength or ranges of wavelength(s) are selected based upon the characteristics of the composition and the surface to be laser marked. Typical settings for a 35 watt $CO_2$ laser for universal laser markings is from about 2% to about 100% of full power at speeds from about 5 to about 100 inches per second. For most coatings, a power level from about 2% to about 35% of full power at speeds from about 3 to about 100 inches per second are used. A 10 watt fiber laser can be used at speeds from about 3 to 100 inches per second and the power can be from about 1 to about 10 watts. The term "speed" as used herein refers to the velocity of the marking head as it moves across the surface being lased. The marking conditions will vary from one laser to another and achieving a mark is not limited to a particular laser. Changing to a higher or lower watt laser would change the marking parameters, and so one could mark at a lower % power and faster speed or vise versa.

The actual power levels as measured at the surface to be marked are slightly different (more or less) than the power measurement of the laser as delivered. As will be appreciated, this is primarily due to the efficiency of the laser tube. A wide array of other lasers can be used such as YAG pulsed lasers, diode lasers, excimer lasers, green lasers, red lasers, UV laser and others.

In accordance with the present subject matter, the size of the laser spot that lasers the marking material is generally greater than 0.1 micron in diameter in one aspect, or from about 0.1 to about 20 microns in another aspect, and or from about 0.5 to about 10 microns in still another aspect. The speed at which the laser beam travels across the surface of the marking material is from 1 to about 100 inches/minute (up to about 250 cm/minute) in one aspect, from about 1 or 2 to about 20 inches/minute (about 2.5 or 5 to 50 cm/minute) in another aspect. The laser beam may be projected with a seam overlap of 1 to 100 percent in one aspect, from about 10 to about 90 percent in another aspect. The laser parameters are controlled in order to provide sufficient localized heating to the marking composition while avoiding unwanted damage to the substrate.

Once the marking composition is applied to a portion of a substrate, the beam emanating from the radiant energy source lasers the marking composition, which absorbs the radiant energy and increases to the required temperature. In absorbing the radiant energy, at least a portion of the marking composition is excited, i.e. has its atoms or molecules raised to an excited state. [See Webster's Encyclopedic Unabridged Dictionary of the English Language (Portland House, New York, 1989), page 497.] Typically, a temperature of 200° to 1500° F. is reached in approximately one to two microseconds. Precise temperatures are controlled by the output power of the radiant energy source and the physical position of the marking material relative to the focal plane of the radiant energy beam and the speed with which the beam is moving. Once the required temperature is achieved, the marking composition will permanently bond with the substrate to form a laser mark on the substrate. Marking compositions can be formulated to absorb specific amounts of a specified wavelength of the radiant energy.

In one aspect, the permanent markings produced in accordance with the present subject matter have an average thickness of from 0 to about 100 microns as measured from the surface of the substrate. In another aspect, the laser marks have an average thickness from about 0.05 to about 30 microns. In accordance with the present subject matter, substantially no indention or removal of the substrate is observed. In the case of glass substrates, it is preferable to avoid removal of the glass because indentations tend to weaken the glass substrate.

Because of the interaction between the substrate and the marking material upon lasing/irradiation, the composition of the final laser mark may depend on the composition of the substrate. Upon irradiation, compositions of the permanent laser marking may include colored or colorless sintered glass frit, inorganic chromophores fused into the surface of the glass or metal substrate, a combination of the two, or metal oxide fused into the glass or metal surface or reacted with the substrate material.

Several different techniques are suitable for laser marking, for example: a) the mask method whereby the area to be marked is substantially uniformly coated with the marking composition and the radiant energy passes through a fixed, data specific mask and impinges onto the marking composition to produce the desired mark; b) the dot-matrix method whereby the area to be marked is substantially uniformly coated with the marking composition and the radiant energy passes through a computer controlled, changeable data, dot-matrix mask and impinges onto the marking composition to produce the desired mark; c) the beam deflection method whereby the area to be marked is substantially uniformly coated with the marking composition and the radiant energy passes through a beam steering head and impinges onto the marking composition to produce the desired mark; d) the X-Y plotter method whereby the area to be marked is substantially uniformly coated with the marking composition and the radiant energy moves on a gantry type X-Y mechanism utilizing mirrors and/or fiber-optics and impinges onto the marking composition to produce the desired mark; e) the part moving method whereby the area to be marked is substantially uniformly coated with the marking composition and the workpiece to be marked is moved using an X-Y motor driven stage under a stationary beam which impinges onto the marking composition to produce the desired mark; or f) the area irradiation method whereby data specific marking composition is substantially uniformly applied to the surface of the workpiece and the data specific marking area is irradiated by means of a beam steering mechanism or by means of moving the workpiece under a stationary beam.

In one aspect, the laser marking methods b), c), d), e) and f) are combined with a laser marking system so that the marking composition can be irradiated with any computer programmed digits, letters and special symbols where the laser beam strikes the marking composition in the most efficient manner possible.

The laser beam, the movement of which can be controlled by a computer, may be used to create discrete symbols or designs or, alternatively, may be serially indexed across the surface of the marking material to create multiple symbols or designs at the same time. For example, a word may be created by separately making each letter of the word with the laser, or by rastering the laser across the entire word to form all of the letters at the same time.

Also contemplated by the present subject matter is a laser marking technique where the marking composition is not applied as a uniform coating to a surface of the substrate, but rather, the marking composition is applied to the substrate in some sort of pattern or design. This pre-irradiated coating, which is applied in a pattern or the like, can thereafter be bonded to the substrate upon laser irradiation of substantially the entire patterned coating. For example, the marking composition can be digitally printed, silk screened, or otherwise applied to a substrate in a pattern, where the marking composition produces shapes on the substrate in the form of letters, pictures, symbols, or the like prior to lasing. That is, the marking composition is applied to produce an image or indicia on the substrate, even before being permanently bonded to the substrate with a laser. In this embodiment, the entire patterned marking composition coating on the substrate may be bonded to the substrate, leaving no excess, unbonded portion to be removed.

During the irradiation step, the surface of the substrate may be exposed to any desired type of atmosphere. For example, the atmosphere may comprise air at atmospheric, sub-atmospheric or super-atmospheric pressures. Furthermore, the atmosphere may comprise an inert gas such as nitrogen, argon or carbon dioxide, an oxidizing atmosphere such as air or oxygen, a reducing atmosphere such as hydrogen or carbon monoxide, or a vacuum. Oxidizing or reducing gases can be used in a combination with inert gases.

It is also possible to control the atmosphere on the surface of the substrate through the type of media the marking composition is dispersed in. The atmosphere to which the surface of the substrate is exposed may affect the color and the quality of the mark. A single laser beam may be used for marking in accordance with the present subject matter. Alternatively, two or more laser beams may be used. For example, a first laser beam may be used to preheat the marking material and substrate, followed by a second laser which is used to bond the marking material to the preheated substrate. This is particularly advantageous for marking glass because preheating may help to reduce internal stress and micro-cracking that can result from the laser marking operation.

Removal of Excess

In one embodiment, the present subject matter methods involve removing the excess marking composition from the substrate. Excess material not bonded to the substrate surface can be removed by conventional cleaning processes. In high-volume applications, the unused marking composition can be recovered from the cleaning process and reused.

Removal of excess marking material is accomplished depending on the form and application technique employed to deliver and apply the marking composition. For example, if the marking composition was in powder form, the excess powder that was not subject to laser irradiation can be removed by wiping, dusting, washing, brushing off, vacuuming, subliming, blowing from the substrate, or the like. On the other hand, if the article used to apply the marking composition was a tape carrier, then the portion of the tape that was not irradiated by the laser can be peeled from the substrate. In any event, the irradiated portion of the marking composition remains adhered to the substrate and forms a permanent mark.

The methods of the present subject matter enable formation of high contrast or dark marks on a substrate. High-contrast marks or dark marks, for the purposes of this disclosure, means marks that are visible to the human eye, and/or machine readable, and are darker than the surrounding material. For example, a high-contrast or dark mark may appear on a transparent substrate to be a black, brown, purple, blue, green or other high-contrast, dark or colored mark.

After formation of a coating of the marking composition on the surface of interest, the coating and underlying surface is selectively irradiated with the noted source of energy, which is preferably a laser. The term "selectively irradiated" refers to directing laser energy to only particular localized portions of the coating and underlying surface. These portions correspond to the shape and/or outline of the desired marks. In one aspect as discussed above wherein the marking material is not uniformly applied as a coating to a surface of a substrate, it will be understood that selectively irradiated regions of the coating may include the entirety of the coating, leaving no excess marking material to be removed.

The laser is preferably operated as previously described, i.e. at the noted power levels and speeds. The distance of the laser source from the surface to be marked varies depending upon the focal length of the laser beam. Typically, one or more lenses can be used to focus the laser beam at 1.5, 2, and 4 inches from the surface for example. For many marking applications, a distance of about 1.5 inches between the lens and the surface to be marked is appropriate for a $CO_2$ laser as described herein.

In one embodiment, the method includes additional or combinations of different marking composition, subsequent applications of marking composition over existing laser marks, and/or the adjustment of laser parameters between the additional coatings. That is, one marking composition can be used to produce a particular color or effect on a substrate, and thereafter or contemporaneously, another marking composition can be used to produce another color or effect on the substrate.

In accordance with the present subject matter, various types of marks may be produced by laser marking. For example, the laser marks may comprise alphanumeric symbols, graphics, logos, designs, decorations, serializations, bar codes, two dimensional matrices and the like. In addition, the markings may comprise three-dimensional lines forming patterns suitable for use in plasma display TV screens, fresnel lenses, polarizing filters, conductive circuits and the like.

In accordance with the present subject matter, permanent markings are formed with high contrast and high resolution. Resolution of the mark is determined by the size of the laser beam and the composition of the marking material. Luminance contrast of the mark from the substrate is typically determined by composition of the marking material, along with the laser beam energy and atmosphere in which the marking is carried out.

In addition, the present markings have favorable wear, corrosion and fade resistance properties that are determined by the marking material and marking parameters. For example, marks created with glass frits have wear, corrosion and fade resistance properties similar to the resistance of the glass from which the frit was made.

Furthermore, by using conventional laser controlled hardware and software, the markings of the present subject matter may be quickly varied from operation to operation for applications such as serialization, bars codes, manufacturing quality control and automated manufacturing.

Marked Substrates

The present subject matter also provides substrates that have been marked with the marking compositions as described herein. The marking compositions form permanent marks on substrates upon being exposed to a laser, or other radiation. The marking compositions produce high contrast marks on metal, glass, ceramic, and polymer substrates. The marks have a luminance, color, and/or degree of opacity that contrasts with the substrate.

The marked substrates, having durable laser marks thereon, are suitable for any number of uses. In accordance with the present subject matter, the forms and uses for the marked substrates is not particularly limited. For non-limiting example, marked substrates can be used in whole or in part as containers, displays, signs, functional objects, and combinations thereof.

EXAMPLES

A series of marking compositions in accordance with the present subject matter were made having varied compositions. The various calcined and wet reaction molybdenum based complex inorganic pigments were made into a final product using the following method. After calcination of the molybdenum pigments the particle size was reduced using high speed ball mills. The particle size reduced molybdenum pigments and additives were made into a water based slurry using a high speed ball mill. After this step dispersion of the water based molybdenum pigment slurry was reduced with ethanol and sprayed at an average thickness of 1 mil using a gravity fed gun onto metal tag substrates. The laser marking molybdenum material covered the metal tags were dried and placed in a fiber and $CO_2$ laser for marking. Using varying speeds and power setting on the laser the tags were marked by the fiber and $CO_2$ lasers. The unbounded material was washed off and the laser marks evaluated for bond strength and contrast.

Many other benefits will no doubt become apparent from future application and development of this technology.

All patents, published applications, and articles noted herein are hereby incorporated by reference in their entirety.

It will be understood that any one or more feature or component of one embodiment described herein can be combined with one or more other features or components of another embodiment. Thus, the present subject matter includes any and all combinations of components or features of the embodiments described herein.

As described hereinabove, the present subject matter solves many problems associated with previous type devices. However, it will be appreciated that various changes in the details, materials and arrangements of parts, which have been herein described and illustrated in order to explain the nature of the present subject matter, may be made by those skilled in the art without departing from the principle and scope of the present subject matter, as expressed in the appended claims.

What is claimed is:

1. A marking composition for forming a mark on a substrate upon being irradiated with a laser, the composition comprising:
    a vehicle; and
    a laser absorber comprising a eutectic composition comprising $MoO_3$ and at least one selected from the group consisting of $WO_3$, $Li_2O$, $Na_2O$, $K_2O$, and combinations thereof.

2. A marking composition for forming a mark on a substrate upon being irradiated with a laser, the composition comprising:
    a vehicle; and
    a laser absorber comprising a eutectic composition comprising $WO_3$ and at least one selected from the group consisting of $MoO_3$, $Li_2O$, $Na_2O$, $K_2O$, and combinations thereof.

3. A marking composition for forming a mark on a substrate upon being irradiated with a laser, the composition comprising:
    a vehicle; and
    a laser absorber comprising a eutectic composition comprising $MoO_3$ and at least one selected from the group consisting of $Li_2O$, $Na_2O$, $K_2O$, and combinations thereof.

4. A marking composition for forming a mark on a substrate upon being irradiated with a laser, the composition comprising:
    a vehicle; and
    a laser absorber comprising a eutectic composition comprising $WO_3$ and at least one selected from the group consisting of $Li_2O$, $Na_2O$, $K_2O$, and combinations thereof.

5. The marking composition according to claim 2, wherein the composition further comprises $MoO_3$.

6. The marking composition according to claim 3, wherein the composition further comprises $WO_3$.

7. The marking composition of claim 1, wherein the laser absorber comprises a eutectic composition comprising $Li_2MoO_4$ and $K_2MoO_4$.

8. A marking composition for forming a mark on a substrate upon being irradiated with a laser, the composition comprising:
    a vehicle; and
    a laser absorber comprising a eutectic composition comprising tungsten oxide and at least one selected from the group consisting of $SrO$, $Nb_2O_5$, and combinations thereof.

9. The marking composition of claim 8, wherein the laser absorber includes oxides selected from the group consisting of
    $SrO+Sr_3WO_6$,
    $Sr_3WO_6+SrWO_4$,
    $SrWO_4+WO_3$,
    $Nb_2O_5+WO_3$ and
    combinations of the foregoing.

10. A method of forming a mark on a substrate, the method comprising:
applying a marking composition to a substrate, the marking composition including:
a vehicle; and
a laser absorber comprising a composition comprising $MoO_3$ and at least one selected from the group consisting of $WO_3$, $Li_2O$, $Na_2O$, $K_2O$, and combinations thereof; and
exposing the marking composition to a laser such that at least a portion of the marking composition increases in temperature, adheres to the substrate, and forms a mark on the substrate that has a luminance, color, and/or degree of opacity that contrasts from the substrate.

11. A method of forming a mark on a substrate, the method comprising:
applying a marking composition to a substrate, the marking composition including:
a vehicle; and
a laser absorber comprising a eutectic composition comprising $WO_3$ and at least one selected from the group consisting of $MoO_3$, $Li_2O$, $Na_2O$, $K_2O$, and combinations thereof; and
exposing the marking composition to a laser such that at least a portion of the marking composition increases in temperature, adheres to the substrate, and forms a mark on the substrate that has a luminance, color, and/or degree of opacity that contrasts from the substrate.

12. A method of forming a mark on a substrate, the method comprising:
applying a marking composition to a substrate, the marking composition including:
a vehicle; and
a laser absorber comprising a eutectic composition comprising $MoO_3$ and at least one selected from the group consisting of $Li_2O$, $Na_2O$, $K_2O$, and combinations thereof; and
exposing the marking composition to a laser such that at least a portion of the marking composition increases in temperature, adheres to the substrate, and forms a mark on the substrate that has a luminance, color, and/or degree of opacity that contrasts from the substrate.

13. A method of forming a mark on a substrate, the method comprising:
applying a marking composition to a substrate, the marking composition including:
a vehicle; and
a laser absorber comprising a eutectic composition comprising $WO_3$ and at least one selected from the group consisting of $Li_2O$, $Na_2O$, $K_2O$, and combinations thereof; and
exposing the marking composition to a laser such that at least a portion of the marking composition increases in temperature, adheres to the substrate, and forms a mark on the substrate that has a luminance, color, and/or degree of opacity that contrasts from the substrate.

14. The method of claim 12 wherein the eutectic composition further comprises $WO_3$.

15. The method of claim 13 wherein the eutectic composition further comprises $MoO_3$.

16. The method of claim 10, wherein the laser absorber comprises a eutectic composition comprising $Li_2MoO_4$ and $K_2MoO_4$.

17. A method of forming a mark on a substrate, the method comprising:
applying a marking composition to a substrate, the marking composition including:
a vehicle; and
a laser absorber comprising tungsten oxide and at least one selected from the group consisting of SrO, $Nb_2O_5$, and combinations thereof; and
exposing the marking composition to a laser such that at least a portion of the marking composition increases in temperature, adheres to the substrate, and forms a mark on the substrate that has a luminance, color, and/or degree of opacity that contrasts from the substrate.

18. The method of claim 17, wherein the laser absorber includes oxides selected from the group consisting of
$SrO+Sr_3WO_6$,
$Sr_3WO_6+SrWO_4$,
$SrWO_4+WO_3$,
$Nb_2O_5+WO_3$ and
combinations of the foregoing.

* * * * *